(12) United States Patent
Kraft et al.

(10) Patent No.: US 11,367,672 B2
(45) Date of Patent: Jun. 21, 2022

(54) SEMICONDUCTOR DEVICE WITH THROUGH-SUBSTRATE VIA

(71) Applicant: ams AG, Premstaetten (AT)

(72) Inventors: Jochen Kraft, Bruck an der Mur (AT); Georg Parteder, Gleisdorf (AT); Anderson Pires Singulani, Graz (AT); Raffaele Coppeta, Graz (AT); Franz Schrank, Graz (AT)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 17/052,452

(22) PCT Filed: Mar. 20, 2019

(86) PCT No.: PCT/EP2019/056964
§ 371 (c)(1),
(2) Date: Nov. 2, 2020

(87) PCT Pub. No.: WO2019/211041
PCT Pub. Date: Nov. 7, 2019

(65) Prior Publication Data
US 2021/0175153 A1    Jun. 10, 2021

(30) Foreign Application Priority Data
May 3, 2018 (EP) .................................. 18170639

(51) Int. Cl.
*H01L 21/00* (2006.01)
*H01L 23/48* (2006.01)
(Continued)

(52) U.S. Cl.
CPC .......... *H01L 23/481* (2013.01); *H01L 23/528* (2013.01); *H01L 24/05* (2013.01);
(Continued)

(58) Field of Classification Search
CPC ...... H01L 23/481; H01L 23/528; H01L 24/05
See application file for complete search history.

(56) References Cited

U.S. PATENT DOCUMENTS

2009/0020842 A1* 1/2009 Shiau ................ H01L 27/14636
257/459
2013/0270670 A1* 10/2013 Yang ....................... H01L 24/11
257/499
(Continued)

FOREIGN PATENT DOCUMENTS

JP    2001189385 A    7/2001
JP    2013118264 A    6/2013
(Continued)

OTHER PUBLICATIONS

Non-Final Office Action in U.S. Appl. No. 16/483,884 dated Feb. 16, 2021, 21 pages.
(Continued)

*Primary Examiner* — Laura M Menz
(74) *Attorney, Agent, or Firm* — MH2 Technology Law Group LLP

(57) ABSTRACT

A semiconductor device includes a semiconductor body, an electrically conductive via which extends through at least a part of the semiconductor body, and where the via has a top side and a bottom side that faces away from the top side, an electrically conductive etch-stop layer arranged at the bottom side of the via in a plane which is parallel to a lateral
(Continued)

direction, where the lateral direction is perpendicular to a vertical direction given by the main axis of extension of the via, and at least one electrically conductive contact layer at the bottom side of the via in a plane which is parallel to the lateral direction. The etch-stop layer is arranged between the electrically conductive via and the contact layer in the vertical direction, the lateral extent in the lateral direction of the etch-stop layer amounts to at least 2.5 times the lateral extent of the via in the lateral direction, and the lateral extent of the contact layer is smaller than the lateral extent of the via or the lateral extent of the contact layer amounts to at least 2.5 times the lateral extent of the via.

12 Claims, 4 Drawing Sheets

(51) Int. Cl.
*H01L 23/528* (2006.01)
*H01L 23/00* (2006.01)
*H01L 23/522* (2006.01)
*H01L 23/532* (2006.01)

(52) U.S. Cl.
CPC .... *H01L 23/5226* (2013.01); *H01L 23/53214* (2013.01); *H01L 23/53228* (2013.01); *H01L 2224/05541* (2013.01); *H01L 2224/05624* (2013.01)

(56) References Cited

U.S. PATENT DOCUMENTS

| | | | |
|---|---|---|---|
| 2014/0264881 A1* | 9/2014 | Carrillo-Ramirez | H01L 24/05 257/774 |
| 2015/0102497 A1* | 4/2015 | Park | H01L 21/76898 257/774 |
| 2015/0311116 A1* | 10/2015 | Matsuura | H01L 21/31111 438/637 |
| 2016/0351441 A1* | 12/2016 | Tsukiyama | H01L 24/13 |
| 2016/0351492 A1* | 12/2016 | Watanabe | H01L 23/53209 |
| 2020/0020611 A1* | 1/2020 | Kraft | H01L 24/05 |
| 2021/0175153 A1* | 6/2021 | Kraft | H01L 23/528 |

FOREIGN PATENT DOCUMENTS

| | | | |
|---|---|---|---|
| JP | 2017168732 A | * | 9/2017 |
| JP | 2017168732 A | | 9/2017 |
| JP | 6711046 B2 | * | 6/2020 |

OTHER PUBLICATIONS

Taiwanese Decision of Rejection in corresponding Taiwanese Application No. 107105265 dated Nov. 10, 2020, 9 pages.
Final Office Action in corresponding U.S. Appl. No. 16/483,884 dated Dec. 4, 2020, 50 pages.
International Search Report and Written Opinion dated Jun. 4, 2019 in PCT Application No. PCT/EP2019/056964, 10 pages.
Korean Examination Report (with English Summary) in Korean Application No. 10-2020-7031244 dated Mar. 9, 2022, 6 pages.

* cited by examiner

SEMICONDUCTOR DEVICE WITH THROUGH-SUBSTRATE VIA

CROSS-REFERENCE TO RELATED APPLICATIONS

The present application is the national stage entry of International Patent Application No. PCT/EP2019/056964, filed on Mar. 20, 2019, which claims the benefit of priority of European Patent Application No. 18170639.1, filed on May 3, 2018, all of which are hereby incorporated by reference in their entirety for all purposes.

BACKGROUND OF THE INVENTION

The present disclosure relates to a semiconductor device.

In order to electrically contact an integrated circuit of a semiconductor device or another part of a semiconductor device, a common method is to form a through silicon via through the silicon substrate of the device. Therefore, a trench is formed in the substrate. The trench is at least partially filled with an electrically conductive contact material and the contact material is electrically isolated against the substrate. An integrated circuit which is arranged at a circuit side of the substrate can be electrically contacted via the through silicon via. The through silicon via can be electrically contacted at a contact side of the substrate facing away from a circuit side of the substrate by a solder bump. In this way, the device or the integrated circuit can be electrically contacted from the contact side of the substrate.

The contact material of the through silicon via is electrically connected with several metal layers which have an overlap with the through silicon via in vertical direction. Usually, several metal layers are arranged below the trench of the through silicon via. The different metal layers are electrically connected with each other by vertical connections. One of the metal layers is in direct contact with the contact material of the through silicon via. Around and between the metal layers an electrically non-conductive material is arranged.

Therefore, in most cases, the coefficients of thermal expansion of the metal layers and the surrounding non-conductive material are different. Because of this difference in the coefficients of thermal expansion, it is possible that during processing of the semiconductor device cracks occur in or around the contact material of the through silicon via or in one of the metal layers. These cracks can lead to leakage currents or it is possible that dirt or humidity can enter the semiconductor device. Consequently, the efficiency of the semiconductor device can be decreased.

SUMMARY OF THE INVENTION

This disclosure provides a semiconductor device with an increased efficiency.

In one embodiment of the semiconductor device, the semiconductor device comprises a semiconductor body. The semiconductor body can be a substrate or a wafer. This means the semiconductor body is a three-dimensional body and it can be a cuboid. The semiconductor body comprises a semiconductor material which can be, for example, silicon.

In one embodiment of the semiconductor device, the semiconductor device comprises an electrically conductive via which extends through at least a part of the semiconductor body, and where the via has a top side and a bottom side that faces away from the top side. The via can be formed as a trench in the semiconductor body and it can be coated or filled with an electrically conductive contact material. It is possible that the trench is etched into the semiconductor device. The contact material can be, for example, tungsten. The contact material can be electrically isolated against the material of the semiconductor body by an electrically non-conductive material as, for example, silicon dioxide. The via can have the shape of a cylinder. In this case the lateral size of the via is given by the diameter of the cylinder. The diameter of the via can, for example, amount to 40 µm or 80 µm.

The top side of the via is in the plane of a contact side of the semiconductor body. At the contact side of the semiconductor body the trench that forms the via is formed. At the bottom side of the via a bottom surface of the trench is positioned. This means, the trench is etched until the bottom surface. On a circuit side of the semiconductor body facing away from the contact side of the semiconductor body, an integrated circuit can be arranged.

In one embodiment of the semiconductor device, the semiconductor device comprises an electrically conductive etch-stop layer arranged at the bottom side of the via in a plane which is parallel to a lateral direction, where the lateral direction is perpendicular to a vertical direction given by the main axis of extension of the via. At the bottom side of the via, an electrically non-conductive material is arranged. In order to prevent that the non-conductive material is etched away during the etching of the via, the etch-stop layer is arranged between the via and the non-conductive material in the vertical direction. The etch-stop layer can comprise a metal as, for example, aluminum or copper. The vertical direction is perpendicular to a main plane of extension of the semiconductor body. The lateral direction is parallel to the main plane of extension of the semiconductor body.

In one embodiment of the semiconductor device, the semiconductor device comprises at least one electrically conductive contact layer at the bottom side of the via in a plane which is parallel to the lateral direction. The contact layer can be electrically connected with other parts of the semiconductor device. For example, the contact layer can be electrically connected with an electrical contact of an integrated circuit of the semiconductor device. By arranging several contact layers at different vertical positions, it is possible to electrically contact different parts of the semiconductor device without consuming more area of the device by forming other electrical contacts or vias.

In one embodiment of the semiconductor device, the etch-stop layer is arranged between the electrically conductive via and the contact layer in the vertical direction. In vertical direction between the etch-stop layer and the contact layer, the non-conductive material is arranged. This means, the etch-stop layer and the contact layer are not in direct contact with each other.

In one embodiment of the semiconductor device, the lateral extent in the lateral direction of the etch-stop layer amounts to at least 2.5 times the lateral extent of the via in the lateral direction. The lateral extent of the etch-stop layer and the via is measured in the lateral direction. If the shape of the etch-stop layer is a circle, the lateral extent in the lateral direction is given by the diameter of the circle. If the shape of the etch-stop layer is a rectangle, the extent in the lateral direction is given by the extent of the rectangle in the lateral direction. The lateral extent of the etch-stop layer is larger than the lateral extent of the via. It is further possible that the lateral extent in the lateral direction of the etch-stop layer amounts to at least 3 times the extent of the via in the lateral direction.

In one embodiment of the semiconductor device, the lateral extent of the contact layer is smaller than the lateral extent of the via or the lateral extent of the contact layer amounts to at least 2.5 times the lateral extent of the via. This means, the lateral extent of the contact layer can either be smaller or larger than the lateral extent of the via. If the lateral extent of the contact layer is larger than the lateral extent of the via, the lateral extent of the contact layer amounts to at least 2.5 times the lateral extent of the via. If the shape of the contact layer is a circle, the lateral extent in the lateral direction is given by the diameter of the circle. If the shape of the contact layer is a rectangle, the extent in the lateral direction is given by the extent of one of the sides of the rectangle in the lateral direction. It is further possible that the lateral extent in the lateral direction of the contact layer amounts to at least 3 times the extent of the via in the lateral direction.

Advantageously, the formation of cracks within the via or at the bottom side of the via is avoided since the lateral extent of the etch-stop layer amounts to at least 2.5 times the lateral extent of the via and the lateral extent of the contact layer is smaller than the lateral extent of the via or the lateral extent of the contact layer amounts to at least 2.5 times the lateral extent of the via. The etch-stop layer and the at least one contact layer are in mechanical contact with the non-conductive material. If the semiconductor device is heated and cooled down again during processing, the metals of the etch-stop layer, the contact layer and the contact material of the via show different thermal expansion than the non-conductive material. Therefore, cracks can occur around the via. However, if the lateral extent of the etch-stop layer amounts to at least 2.5 times the lateral extent of the via and the lateral extent of the contact layer is smaller than the lateral extent of the via or the lateral extent of the contact layer amounts to at least 2.5 times the lateral extent of the via, the probability for the formation of cracks is significantly reduced. Therefore, the semiconductor device can be operated more efficiently.

In one embodiment of the semiconductor device, the semiconductor device comprises the semiconductor body, the electrically conductive via which extends through at least a part of the semiconductor body, where the via has a lateral size which is given in the lateral direction and where the via has a top side and a bottom side that faces away from the top side. The semiconductor further comprises the electrically conductive etch-stop layer arranged at the bottom side of the via in a plane which is parallel to the lateral direction, and at least one electrically conductive contact layer at the bottom side of the via in a plane which is parallel to the lateral direction, wherein the lateral extent in the lateral direction of the etch-stop layer is larger than the lateral size of the via, the lateral extent in the lateral direction of the contact layer is smaller than the lateral size of the via, and the etch-stop layer is arranged between the electrically conductive via and the contact layer in the vertical direction.

Simulations yielded preferred values for the lateral extent in the lateral direction of the contact layer. For the simulations, a crack is induced in a sidewall of the via close to the bottom side of the via. The energy release by introducing the crack is calculated and gives the probability that a crack will occur. For a diameter of the via of 40 µm, the lateral extent in the lateral direction of the contact layer can be 10 to 39 µm. The lateral extent in the lateral direction of the contact layer can amount to 30 µm.

In one embodiment of the semiconductor device, the etch-stop layer is arranged symmetrically with respect to the via. The via can have a symmetry axis which is parallel to the vertical direction. The etch-stop layer can be arranged symmetrically with respect to the symmetry axis of the via. As the lateral extent of the etch-stop layer is larger than the lateral extent of the via, the etch-stop layer extends further in the lateral direction than the via. On both sides of the via the etch-stop layer can extend further in the lateral direction than the via by the same amount.

In one embodiment of the semiconductor device, the contact layer is arranged symmetrically with respect to the via. The contact layer can be arranged symmetrically with respect to the symmetry axis of the via. If the lateral extent of the contact layer is smaller than the lateral extent of the via, the lateral extent of the contact layer can be smaller than the lateral extent of the via by the same amount on both sides of the via. If the lateral extent of the contact layer is larger than the lateral extent of the via, the lateral extent of the contact layer can be larger than the lateral extent of the via by the same amount on both sides of the via.

In one embodiment of the semiconductor device, the lateral extent of the etch-stop layer in the lateral direction is larger than the lateral extent of the contact layer in the lateral direction. By reducing the lateral extent of the contact layer in comparison to the lateral extent of the etch-stop layer, the total amount of electrically conductive material which is contact with the non-conductive material can be reduced. In this way, the probability for the formation of cracks within or around the via can be reduced.

In one embodiment of the semiconductor device, the lateral extent of the contact layer in the lateral direction is larger than the lateral extent of the etch-stop layer in the lateral direction. In this way, the contact layer can be electrically connected with other parts of the semiconductor device which are arranged further away from the via.

In one embodiment of the semiconductor device, at least one further contact layer is arranged at the bottom side of the via in a plane which is parallel to the lateral direction. The further contact layer can for example be arranged between the etch stop layer and the contact layer in vertical direction. The further contact layer can comprise an electrically conductive material. It is further possible that the semiconductor device comprises several contact layers. The contact layers can be arranged as a stack of contact layers where the etch-stop layer is arranged between the via and the stack of contact layers in vertical direction. This means, the contact layers are arranged above each other in vertical direction and optionally they exhibit the same size. Between the contact layers the non-conductive material is arranged. If the semiconductor device comprises several contact layers parts of the semiconductor device that are further away from the etch-stop layer in vertical direction can be electrically contacted.

In one embodiment of the semiconductor device, the lateral extent of the further contact layer is smaller than the lateral extent of the via or the lateral extent of the further contact layer amounts to at least 2.5 times the lateral extent of the via. This means, the lateral extent of the further contact layer can either be smaller or larger than the lateral extent of the via. If the lateral extent of the further contact layer is larger than the lateral extent of the via, the lateral extent of the further contact layer amounts to at least 2.5 times the lateral extent of the via. It is further possible that the lateral extent in the lateral direction of the further contact layer amounts to at least 3 times the extent of the via in the lateral direction. The lateral extent of the further contact layer can be different from the lateral extent of the contact layer. The lateral extent of the further contact layer can be larger than the lateral extent of the contact layer. It is further possible that the lateral extent of the further contact layer is smaller than the lateral extent of the contact layer.

In one embodiment of the semiconductor device, the etch-stop layer comprises copper and/or aluminum. If the etch-stop layer comprises aluminum, the lateral extent of the etch-stop layer amounts to at least 2.5 times the lateral extent of the via. The etch-stop layer comprises copper, the lateral extent of the etch-stop layer amounts to at least 3 times the lateral extent of the via. In this way, advantageously the formation of cracks within and around the via is avoided.

In one embodiment of the semiconductor device, the contact layer comprises copper and/or aluminum. If the contact layer comprises aluminum, the lateral extent of the contact layer amounts to at least 2.5 times the lateral extent of the via. The contact layer comprises copper, the lateral extent of the contact layer amounts to at least 3 times the lateral extent of the via. In this way, advantageously the formation of cracks within and around the via is avoided.

In one embodiment of the semiconductor device, the etch-stop layer and the contact layer are electrically connected by at least one electrically conductive connection. The etch-stop layer and the contact layer can be connected by several connections. If the semiconductor device comprises several contact layers, the contact layers can also be electrically connected by the connections. The connections can be arranged between the etch-stop layer and the contact layer in vertical direction and they can be parallel to the vertical direction. The connections can comprise a metal.

In one embodiment of the semiconductor device, at least one of the etch-stop layer and the contact layer is electrically connected with an integrated circuit of the semiconductor device. The integrated circuit of the semiconductor device can comprise an electrical contact which can be electrically connected with the etch-stop layer or one of the at least one contact layer. Therefore, the electrical contact can be arranged in the lateral direction next to the etch-stop layer or one of the at least one contact layer. The integrated circuit of the semiconductor device can be arranged on the semiconductor body on the circuit side.

In one embodiment of the semiconductor device, at least one of the at least one contact layer is a structured layer which is structured with an electrically non-conductive material in such a way that it is formed as a grid. The contact layer can be structured in such a way that in some areas it comprises a metal and in other areas, it comprises the non-conductive material. In this way, a grid is formed. Consequently, the probability of crack formation decreases since the total amount of metal is reduced. The contact layer which is structured in such a way that it forms a grid can have a larger thickness in vertical direction than the etch-stop layer.

In one embodiment of the semiconductor device, the etch-stop layer and the contact layer contact a single via. Each via of the semiconductor device can be contacted with dedicated etch-stop and contact layers. That way each via is electrically isolated from other vias, while the probability for the formation of cracks within or around each via is reduced. Also, formation of cracks in semiconductor devices having only a single via can be significantly reduced.

In one embodiment of the semiconductor device, the lateral extent of the contact layer amounts to at least 5 times the lateral extent of the via. Further increasing the lateral extent of the contact layer with respect to the via can lead to further reduction of the probability for formation of cracks within or around the via.

BRIEF DESCRIPTION OF THE DRAWINGS

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures.

DETAILED DESCRIPTION

Figure 1:
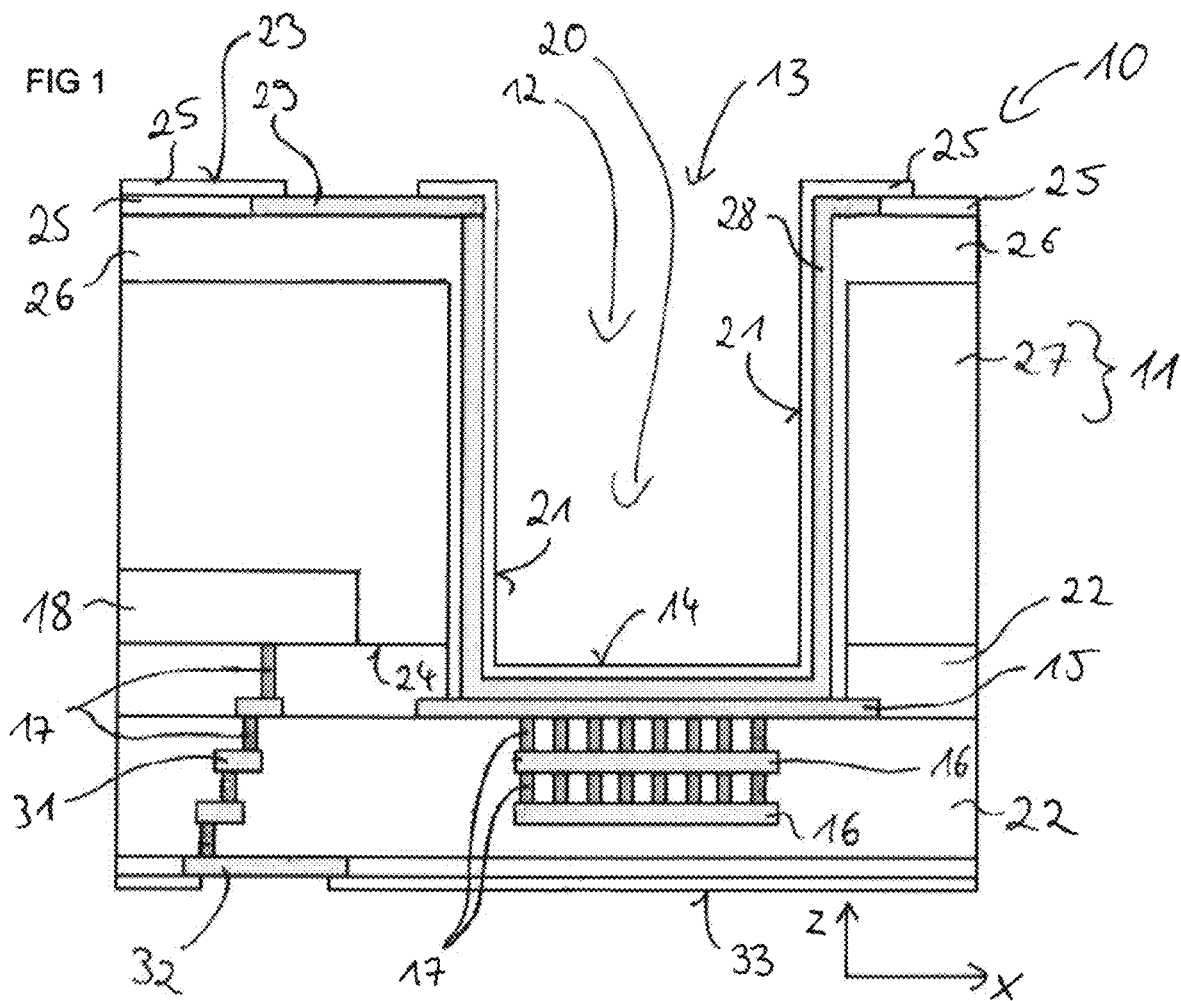
FIG. 1 shows a cutaway view of an exemplary embodiment of the semiconductor device.

In FIG. 1, a cutaway view of an exemplary embodiment of a semiconductor device 10 is shown. The semiconductor device 10 comprises a semiconductor body 11. The semiconductor body 11 comprises a substrate 27. The substrate 27 can, for example, comprise silicon. Furthermore, an electrically non-conductive material 22 is arranged on the substrate 27 at a circuit side 24 of the semiconductor body 11. Within the non-conductive material 22, other materials such as metals are arranged. Moreover, at the circuit side 24 of the semiconductor body 11 an integrated circuit 18 is arranged.

An electrically conductive via 12 extends through the semiconductor body 11 and a part of the non-conductive material 22. The via 12 has a main axis of extension which is perpendicular to the main plane of extension of the substrate 27. This means the main axis of extension of the via 12 is parallel to a vertical direction z which is perpendicular to the main plane of extension of the substrate 27. The via 12 has a lateral size which is given in a lateral direction x that is perpendicular to the vertical direction z. This means the lateral direction x is parallel to the main plane of extension of the substrate 27. The via 12 has a top side 13 which faces away from the non-conductive material 22. A bottom side 14 of the via 12 is arranged at the side of the via 12 which faces away from the top side 13 of the via 12.

The via 12 can be formed in the semiconductor body 11 by etching a trench 20 in the semiconductor body 11 from a contact side 23 which faces away from the non-conductive material 22. The trench 20 comprises inner walls 21 which are coated with an isolation layer 26. The isolation layer 26 is deposited at the top side 13 of the via 12 such that also the substrate 27 is at least partially covered with the isolation layer 26. After the deposition of the isolation layer 26, the inner walls 21 of the trench 20 are coated with an electrically conductive contact material 28 which can be tungsten. After the deposition of the contact material 28, a passivation layer 25 is deposited at the inner walls 21 of the trench 20. Furthermore, a back contact 29 is deposited at the contact side 23 of the semiconductor body 11 where the back contact 29 can be electrically contacted. The back contact 29 can comprise aluminum. The contact side 23 of the semiconductor body 11 is partially coated with another passivation layer 25.

In this embodiment, the trench 20 of the via 12 is not completely filled with the isolation layer 26, the passivation layer 25 and the contact material 28. This means the via 12 comprises an inner volume which is free of the isolation layer 26, the contact material 28 and the passivation layer 25.

At the bottom side 14 of the via 12, an electrically conductive etch-stop layer 15 is arranged in a plane which is parallel to the lateral direction x. When the trench 20 is etched in the semiconductor body 11, the material of the semiconductor body 11 and the non-conductive material 22 is etched until the etch-stop layer 15. This means the etch-stop layer 15 acts as an etch stop for the etching of the trench 20.

The etch-stop layer 15 can be formed by aluminum or copper and the lateral extent in the lateral direction x of the etch-stop layer 15 amounts to 2.5 times the lateral extent of the via 12. FIG. 1 is not drawn to scale. The etch-stop layer 15 is arranged symmetrically below the via 12 with respect to the vertical direction z.

Two electrically conductive contact layers 16 are arranged at the bottom side 14 of the via 12 in a plane which is parallel to the lateral direction x and the etch-stop layer 15 is arranged between the via 12 and the contact layers 16 in vertical direction z. This means the two contact layers 16 are arranged below the etch-stop layer 15 in vertical direction z and they are also symmetrically arranged with respect to the vertical direction z. The lateral extent in the lateral direction x of the contact layers 16 is smaller than the lateral extent of the via 12. The contact layers 16 can comprise copper and/or aluminum.

The first contact layer 16 which is arranged between the second contact layer 16 and the etch-stop layer 15 is electrically connected with the etch-stop layer 15 by electrically conductive connections 17 which extend in vertical direction z between the etch-stop layer 15 and the first contact layer 16. The second contact layer 16 is electrically connected with the first contact layer 16 by the connections 17 which extend in vertical direction z between the two contact layers 16. The etch-stop layer 15 is in mechanical and electrical contact with the contact material 28 at the bottom side 14 of the via 12. The etch-stop layer 15, the contact layer 16 and the connections 17 are surrounded by the non-conductive material 22.

If the semiconductor device 10 is heated and cooled down again during processing, the metals of the etch-stop layer 15, the contact layer 16 and the contact material 28 of the via 12 show different thermal expansion than the non-conductive material 22. Therefore, cracks can occur around the via 12. However, since the lateral extent in the lateral direction x of the contact layer 16 is smaller than the lateral size of the via 12, the total area where a metal is in mechanical contact with the non-conductive material 22 is decreased. If the lateral extent in the lateral direction x of the contact layer 16 is below or above a critical size, no cracks are formed because of the difference in the coefficients of thermal expansion. Therefore, the semiconductor device 10 can be operated more efficiently.

In the lateral direction x next to the contact layer 16 and the etch-stop layer 15, several metal pads 31 can be arranged. In this case, the metal pads 31 are arranged in the same lateral planes as the etch-stop layer 15 and the contact layer 16. The metal pads 31 can comprise a metal as, for example, aluminum. The metal pads 31 are electrically connected by connections 17. It is possible that the contact layers 16 are electrically connected with one of the metal pads 31. It is possible that the contact layers 16 are electrically connected with the metal pads 31 in another plane through the semiconductor device 10 which is not shown in FIG. 1. The metal pads 31 are electrically connected with an electrically conductive top contact 32 of the semiconductor device 10 and the integrated circuit 18. The top contact 32 of the semiconductor device 10 is arranged at a top contact side 33 of the semiconductor device 10 which faces away from the contact side 23 of the semiconductor body 11. The top contact 32 can have a thickness in vertical direction z that is larger than the thickness of the etch-stop layer 15 and of the contact layer 16.

Figure 2:
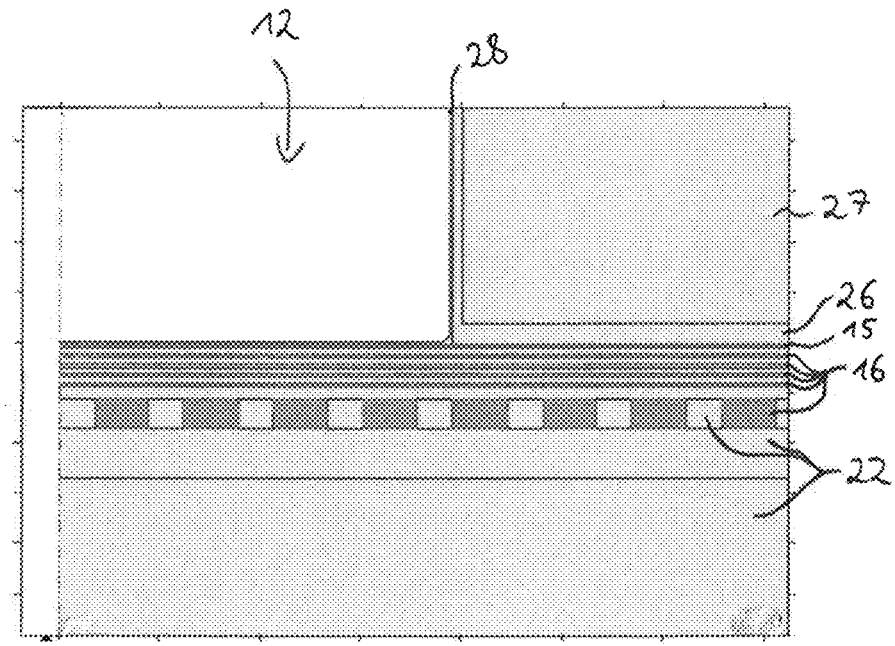
FIG. 2 shows cutaway views of a part of exemplary embodiments of the semiconductor device.

In FIG. 2, a schematic cutaway view of a part of an exemplary embodiment of the semiconductor device 10 is shown. The via 12 is arranged within the semiconductor body 11 and the inner walls 21 of the via 12 are coated with an isolation layer 26 and the contact material 28. The etch-stop layer 15 is arranged at the bottom side 14 of the via 12. Five contact layers 16 are also arranged at the bottom side 14 of the via 12. The lateral extent in the lateral direction x of the contact layers 16 amounts to at least 2.5 times the lateral extent of the via 12. The contact layer 16 which is the furthest away from the via 12 in vertical direction z is thicker in vertical direction z than the other contact layers 16. Moreover, the thicker contact layer 16 is structured with the non-conductive material 22. It is structured in such a way that a grid structure of the thicker contact layer 16 is formed. Consequently, the probability of crack formation can be decreased since the total amount of metal is reduced.

Figure 3:
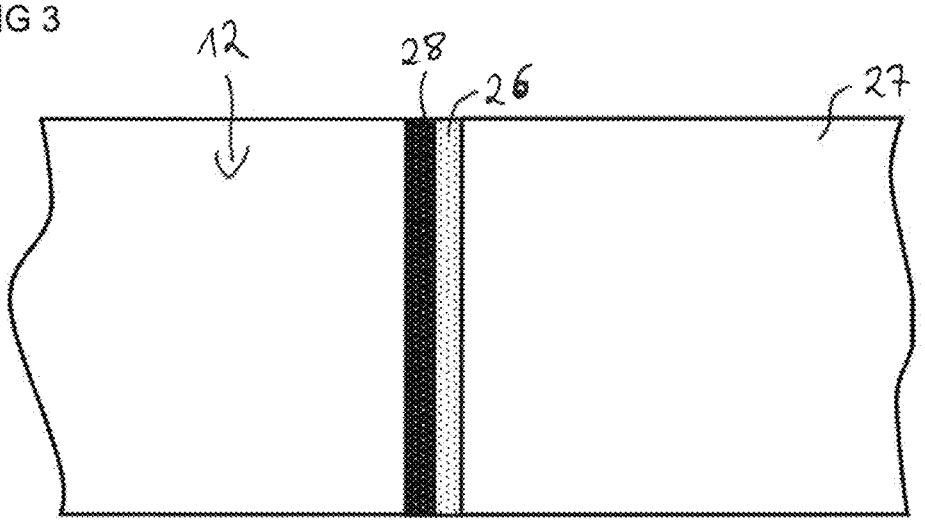
FIG. 3 shows cutaway views of a part of exemplary embodiments of the semiconductor device.
Figure 3:
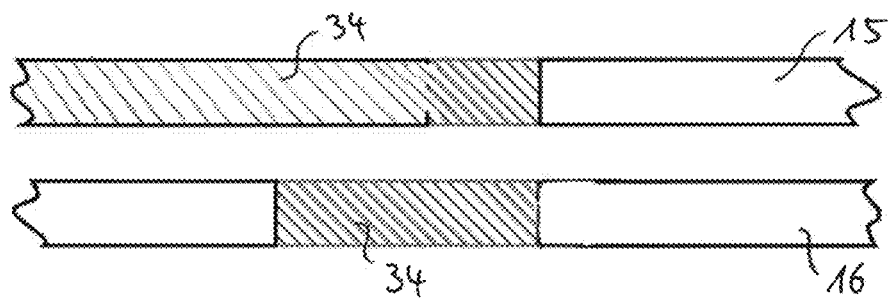

In FIG. 3, a schematic cutaway view of a part of a further exemplary embodiment of the semiconductor device 10 is shown. It is shown that the lateral extent in the lateral direction x of the etch-stop layer 15 amounts to at least 2.5 times the lateral extent of the via 12 in the lateral direction x. This means, the lateral extent of the etch-stop layer 15 can have any value which is larger than 2.5 times the lateral extent of the via 12 and which does not exceed the size of the semiconductor device. The region within the etch-stop layer 15 which is marked by dashed lines is an exclusion zone 34. This means, the lateral extent of the etch-stop layer 15 does not have any value which is within the exclusion zone 34. It is further shown that the lateral extent of the contact layer 16 is smaller than the lateral extent of the via 12 or the lateral extent of the contact layer 16 amounts to at least 2.5 times the lateral extent of the via 12. Another exclusion zone 34 arranged within the contact layer 16 shows that the lateral extent of the contact layer 16 does not have any value within the exclusion zone 34.

Figure 4:
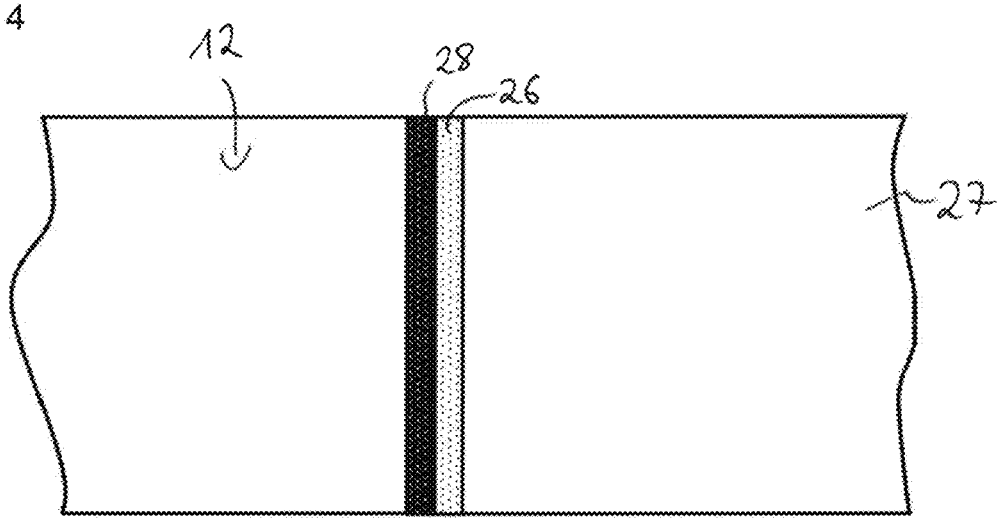
FIG. 4 shows cutaway views of a part of exemplary embodiments of the semiconductor device.
Figure 4:
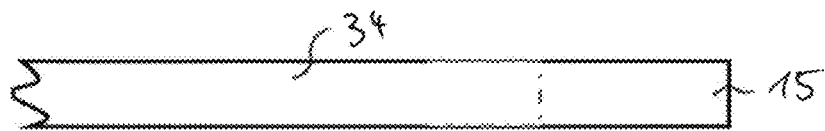
Figure 4:
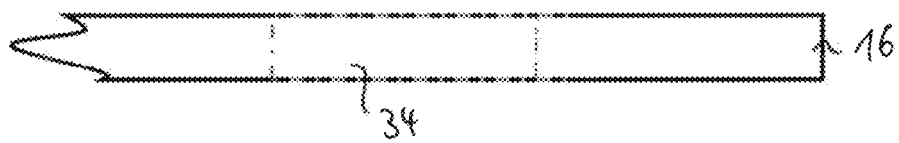

In FIG. 4, a schematic cutaway view of a part of a further exemplary embodiment of the semiconductor device 10 is shown. The lateral extent of the contact layer 16 in the lateral direction x is larger than the lateral extent of the etch-stop layer 15 in the lateral direction x.

Figure 5:
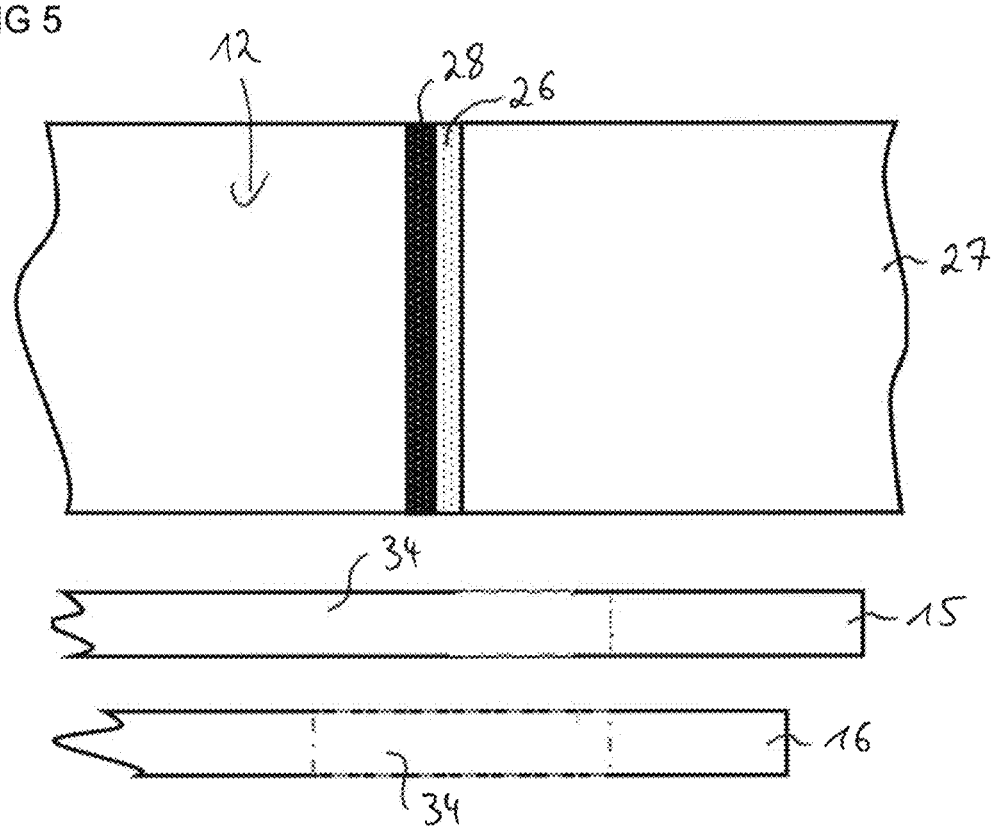
FIG. 5 shows cutaway views of a part of exemplary embodiments of the semiconductor device.

In FIG. 5, a schematic cutaway view of a part of a further exemplary embodiment of the semiconductor device 10 is shown. The lateral extent of the etch-stop layer 15 in the lateral direction x is larger than the lateral extent of the contact layer 16 in the lateral direction x.

Figure 6:
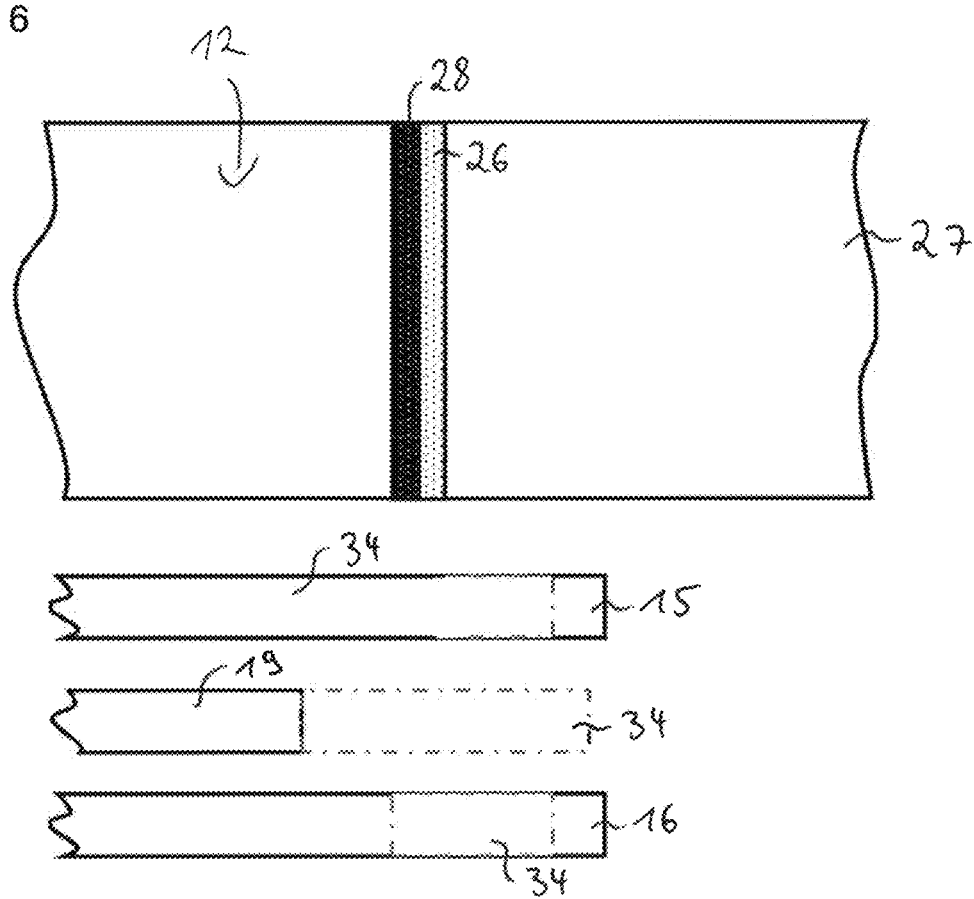
FIG. 6 shows cutaway views of a part of exemplary embodiments of the semiconductor device.

In FIG. 6, a schematic cutaway view of a part of a further exemplary embodiment of the semiconductor device 10 is shown. The semiconductor device 10 comprises a further contact layer 19. The further contact layer 19 is arranged between the etch-stop layer 15 and the contact layer 16 in vertical direction z. The lateral extent of the further contact layer 19 is smaller than the lateral extent of the via 12. Furthermore, the lateral extent of the further contact layer 19 can be smaller than the lateral extent of the contact layer 16.

Therefore, the exclusion zone 34 of the further contact layer 19 extends further in lateral direction x than the exclusion zone 34 of the contact layer 16.

Figure 7:
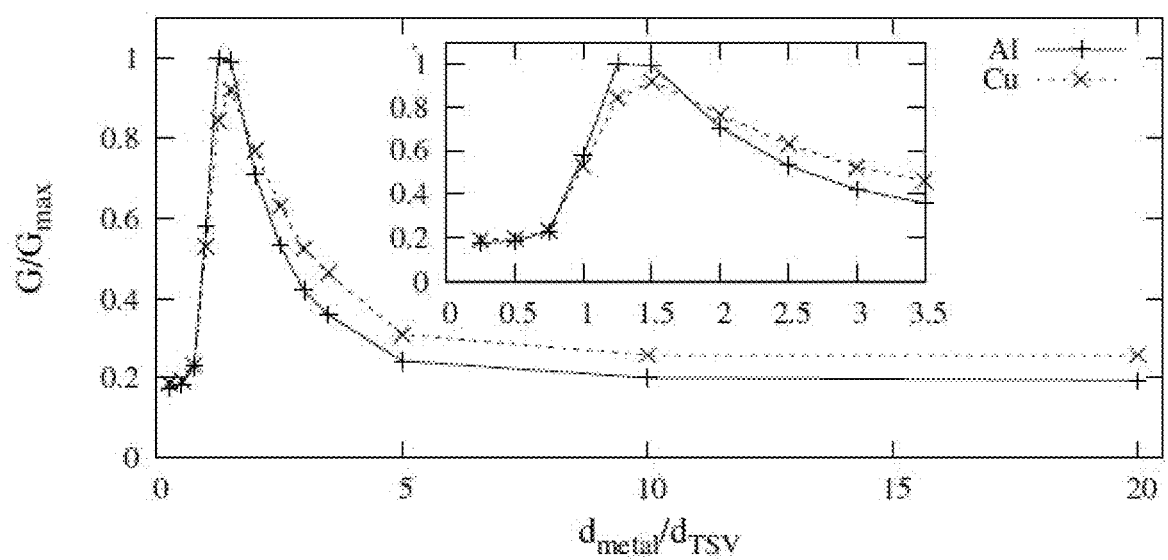
FIG. 7 illustrates the probability for formation of cracks within or around the via in dependence of lateral extents of the contact layer.

FIG. 7 shows the potential energy release rate G normalized with respect to the highest value $G_{max}$ of a contact layer made of aluminum. The data is plotted as a function of the ratio of the lateral extents of the contact layer $d_{metal}$ and the lateral extent of the via $d_{TSV}$. The inset features a magnified view of the same data for detailing ratios below 3.5. The probability for formation of cracks within or around the via is proportional to G. In other words, a large value of G indicates a high probability for formation of cracks. It can be seen from the plot that at ratios smaller than 1 as well as for ratios larger than 2.5, the probability for formation of cracks is significantly reduced by at least 40% for contact layers comprising aluminum and/or copper.

We claim:

1. A semiconductor device, comprising:
    a semiconductor body;
    an electrically conductive via which extends through at least a part of the semiconductor body, and where the via has a top side and a bottom side that faces away from the top side;
    an electrically conductive etch-stop layer arranged at the bottom side of the via in a plane which is parallel to a lateral direction, where the lateral direction is perpendicular to a vertical direction given by the main axis of extension of the via; and
    at least one electrically conductive contact layer at the bottom side of the via in a plane which is parallel to the lateral direction, wherein:
    the etch-stop layer is arranged between the electrically conductive via and the contact layer in the vertical direction and is electrically connected with the contact layer by at least one electrically conductive connection,
    the lateral extent in the lateral direction of the etch-stop layer amounts to at least 2.5 times the lateral extent of the via in the lateral direction, and
    the lateral extent in the lateral direction of the contact layer is smaller than the lateral extent of the via in the lateral direction.

2. The semiconductor device according to claim 1, wherein the etch-stop layer is arranged symmetrically with respect to the via.

3. The semiconductor device according to claim 1, wherein the contact layer is arranged symmetrically with respect to the via.

4. The semiconductor device according to claim 1, wherein at least one further contact layer is arranged at the bottom side of the via in a plane which is parallel to the lateral direction.

5. The semiconductor device according to claim 4, wherein the lateral extent of the further contact layer is smaller than the lateral extent of the via or the lateral extent of the further contact layer amounts to at least 2.5 times the lateral extent of the via.

6. The semiconductor device according to claim 1, wherein the etch-stop layer comprises copper and/or aluminum.

7. The semiconductor device according to claim 1, wherein the contact layer comprises copper and/or aluminum.

8. The semiconductor device according to claim 1, wherein at least one of the etch-stop layer and the contact layer is electrically connected with an integrated circuit of the semiconductor device.

9. The semiconductor device according to claim 1, wherein at least one of the at least one contact layer is a structured layer which is structured with an electrically non-conductive material in such a way that it is formed as a grid.

10. The semiconductor device according to claim 1, wherein the lateral extent of the etch-stop layer and the lateral extent of the contact layer reduces the probability for the formation of cracks within or around the via.

11. The semiconductor device according to claim 1, wherein the etch-stop layer and the contact layer contact a single via.

12. The semiconductor device according to claim 1, wherein the lateral extent of the contact layer amounts to at least 5 times the lateral extent of the via.

* * * * *